United States Patent
Vrtis et al.

(10) Patent No.: US 6,751,099 B2
(45) Date of Patent: Jun. 15, 2004

(54) COATED HEAT SPREADERS

(75) Inventors: Joan K. Vrtis, Phoenix, AZ (US); Joni G. Hansen, Phoenix, AZ (US); Thomas J. Fitzgerald, Phoenix, AZ (US); Carl L. Deppisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/023,073

(22) Filed: Dec. 20, 2001

(65) Prior Publication Data

US 2003/0117775 A1 Jun. 26, 2003

(51) Int. Cl.⁷ .................................................. H05K 7/20
(52) U.S. Cl. ........................ 361/705; 156/303.1; 165/185; 252/511; 257/706; 524/270
(58) Field of Search ............................ 361/704, 705, 361/709–712, 715, 717–719; 257/706, 707, 713, 717; 428/403, 404, 901; 156/300, 303.1, 306.6, 309.3, 327; 124/16.3; 165/80.3, 185; 252/510, 511, 518; 524/270, 430, 524

(56) References Cited

U.S. PATENT DOCUMENTS

| | | | | |
|---|---|---|---|---|
| 4,858,073 A | * | 8/1989 | Gregory | 361/708 |
| 5,489,805 A | | 2/1996 | Hackitt et al. | |
| 6,008,988 A | | 12/1999 | Palmer | |
| 6,197,859 B1 | * | 3/2001 | Green et al. | 524/270 |
| 6,219,243 B1 | | 4/2001 | Ma et al. | |
| 6,228,452 B1 | * | 5/2001 | Oka et al. | 428/41.8 |
| 6,462,410 B1 | * | 10/2002 | Novotny et al. | 257/707 |

OTHER PUBLICATIONS

PGpub, U.S. 2002/0009826 A1, filed Apr. 10, 2001.*
U.S.PGPUB 2002/0171132 A1, Buchwalter, Mar. 9, 2001.*
Bath, J., Selectron Corp., *Lead Free Process Group Update*, National Electronics Manufacturing Initiative, Jan. 17, 2001.
DeBiase, J., *Organic Solderability Preservatives: Benzotriazoles and Substituted Benzotrimidazoles*, Proceedings of the SMTA, 1996.
*Double Sided 4Mb SRAM Coupled Cap PBGA Card Assembly Guide*, IBM Application Note, Feb., 1998.
Hart, K., et al., *DFE Study Gives Alternative Finishes the Green Light*, PC Fab, Oct. 2000.
Johnson, R.W., et al., *Thermal Cycle Reliability of Solder Joints to Alternate Plating Finishes*, paper from Auburn University, 2000.
*Kester Solder Paste for Surface Mount and General Electronics Assemblies*, Online Catalog of Preferred Products, 2001.

(List continued on next page.)

*Primary Examiner*—G. Tolin
(74) *Attorney, Agent, or Firm*—Blakely, Sokoloff, Taylor & Zafman LLP

(57) ABSTRACT

A coated heat spreader for a die includes a body and a coating on a surface of the body, wherein the outermost coating is an organic surface protectant. An IC package includes a die thermally coupled to a heat spreader coated with an organic surface protectant. A PCB assembly including a die thermally coupled to a heat spreader coated with an organic surface protectant, where the die is part of an IC package or is directly attached to the PCB. A method of making a coated heat spreader includes coating the organic surface protectant onto a surface of the heat spreader.

15 Claims, 3 Drawing Sheets

OTHER PUBLICATIONS

Morawska, Z., et al., *Lead–Free Solderability Preservative Coatings for PCBs*, Advanced Microelectronics, v. 28, No. 3, May/Jun. 2001.

Parquet, D., et al, *OSP: The High Performance Surface Finish*, Electronic Interconnect Conference, 1997.

Romm, D., et al., *Evaluation of Ni/Pd—Finished ICs with Lead Free Solder Alloys*, Texas Instruments Application Report SZZA024, Jan. 2001.

Solberg, V., *Impact of PCB Surface Finish on SMT Assembly Process Yield*, Application Note from Tessera Corp.

Syed, A., Amkor Technology Corp., *Surface Mount Requirements for Advanced Packaging Solutions*, 2000.

Wengenroth, K., et al., *OSPs: Addressing Future Surface Finish Needs*, Proceedings of the SMTA, 2000, (Abstract).

Debiase, Joseph D., Organic Solderability Preservatives: Benzotriazoles And Substituted Benzimidazoles, Enthone–OMI Inc.; Conference Proceedings; Surface Mount international Conference; Sep. 10, 1996; Abstract page downloaded from Surface Mount Technology Association; SMTA Headquarters—5200 Willson Road, Suite 215, Edina, Minnesota, 55424; 1 page.

Debiase, Joseph D., Organic Solderability Preservatives: Benzotriazoles And Substituted Benzimidazoles, Proceedings Of the SMTA, 1996, Enthone–OMI Inc., New Haven, Connecticut, pp. 763–776.

Wengenroth, Karl, et al., OSPS: Addressing Future Surface Finishing Needs, Enthone–OMI; Conference Proceedings; Surface Finishes Forum Conference; May 4, 2000; Abstract page downloaded from Surface Mount Technology Association; SMTA Headquarters—5200 Willson Road, Suite 215, Edina, Minnesota, 55424; 1 page.

* cited by examiner

COATED HEAT SPREADERS

BACKGROUND OF THE INVENTION

1. Field of the Invention

The invention relates to thermal heat spreaders, integrated circuit ("IC") assemblies containing heat spreaders, and methods of making the heat spreaders and assemblies.

2. Related Art

An IC die may be mounted on a substrate to form an IC assembly. For example, a die may be mounted on a package substrate to form an IC package, or the die may be mounted directly to a printed circuit board ("PCB"). To dissipate heat from the die, a heat spreader is typically thermally coupled to the back of the die. Generally, there is a thermal interface material ("TIM") between the die and the heat spreader. Poor adhesion between the TIM and the heat spreader is a common problem.

There is therefore a need to improve adhesion between the heat spreader and the TIM. There also is a need to improve such adhesion in a cost-effective manner.

BRIEF DESCRIPTION OF THE DRAWINGS

Features and details of the invention can be found in the illustrative embodiments of the invention which are described below with reference to the drawings, in which.

DETAILED DESCRIPTION OF THE PREFERRED EMBODIMENTS

Figure 1:
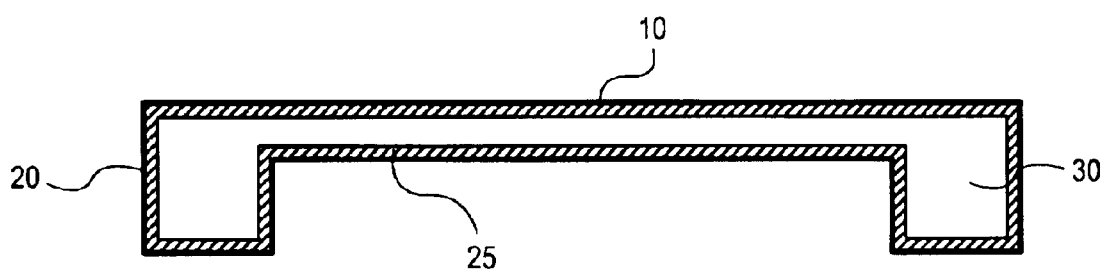
FIG. 1 shows a cross-section of an embodiment of a coated heat spreader.

FIG. 1 shows an embodiment of a heat spreader 10 of the invention. Heat spreader 10 includes body 30, which is made of copper. The heat spreader body 30 may be made of any thermally conductive metal or alloy. Preferably, the body is composed of copper, nickel, aluminum, tin, or gold metal, or alloys thereof. More preferably, the body is composed of copper.

The body may have a variety of shapes depending on the specific application, but generally the body provides a surface for efficient thermal coupling to the die. A preferred shape for the body is a substantially flat surface, for abutting the die, and sidewalls that flank the die and descend down from the flat surface to the package substrate, such that the body has the general shape of a lid or cap. In other embodiments where the die is directly mounted on a PCB, the sidewalls may descend down from the flat surface to the PCB. Heat spreader body 30 is an example of such a lid shape. The body may extend significantly beyond the periphery of the die as needed to dissipate heat by an appropriate amount for the particular die or package.

An organic surface protectant ("OSP") coating 20 lines the surface of the heat spreader body 30. In the embodiment of FIG. 1, the OSP coating 20 is formed by applying COBRATEC® 939, which is a blend of azoles. Any suitable OSP may be used, e.g., any of the organic solderability preservatives used for coating PCB lands. Organic solderability preservatives are used to coat PCB lands that are sites for solder joints. This prevents oxides, which can jeopardize good solder joint adhesion, from forming on the surface. Examples of suppliers of organic solderability preservatives include Enthone, Inc. (West Haven, Conn.), Kester Solder (Des Plaines, Ill.), PMC Specialties Group, Inc. (Westlake, Ohio), and Tamura Kaken Co. Ltd. (Tokyo, Japan).

The OSP preferably comprises one or more substituted or unsubstituted imidazole or triazole compounds in aqueous solution. Examples of imidazole compounds include benzimidazoles. Examples of triazole compounds include but are not limited to benzotriazole, tolyltriazole, carboxybenzotriazole, and sodium tolyltriazole, and potassium or sodium salts thereof. OSPs may also be based on organic esters of dicarboxylic acids. Examples of OSP products include the COBRATEC® (PMC Specialties Group, Inc.) line of metal protection products, e.g., COBRATEC® 99, COBRATEC® 45-I, COBRATEC® CBT, COBRATEC® 939, and COBRATEC® 948. OSPs from other manufacturers include, e.g., Entek Plus 56 and 106A (Enthone, Inc.), and Protecto® 5630 and 5631 (Kester Solder).

The OSP may be provided as a liquid or as a solid that is mixed prior to coating a heat spreader. For example, an OSP liquid may contain 0.5–2.0 wt % of solids. The OSP may be blended with a co-solvent. Preferred co-solvents are polar solvents. Particularly preferred polar co-solvents are glycols, alcohols, and aminoalcohols. Examples of co-solvents include but are not limited to ethylene glycol, diethylene glycol, propylene glycol, isopropanol, and triethanolamine. The OSP solution may be heated during step 90, e.g., to a temperature of from 35° C. to 50° C.

The thickness of the OSP coating on the coated heat spreader may vary, e.g., depending on the particular OSP and the deposit time. For example, for certain OSPs the coating thickness may range from 0.1 $\mu$m to 1.0 $\mu$m or from 0.2 $\mu$m to 0.5 $\mu$m.

In the embodiment shown in FIG. 1, the entire surface of body 30 is coated. In other embodiments, however, the surface of the heat spreader may be partially coated. Additionally, FIG. 1 shows an optional metal coating 25 that has been plated onto the heat spreader before the application of the OSP 20. This metal coating can be Ni or Pd.

Once applied to a heat spreader, the presence of an OSP coating may be verified on a test coupon using gas chromatography, UV (ultraviolet) spectroscopy, or mass spectrometry. The OSP coating may impart a visible coloration to the heat spreader body, e.g., a triazole imparts an orange-blue tinge to a copper-based heat spreader.

In one embodiment of the invention, an IC die that is thermally coupled to a coated heat spreader is incorporated into a PCB assembly as part of an IC package. Alternatively, the IC die may be directly attached to the PCB.

Figure 2:
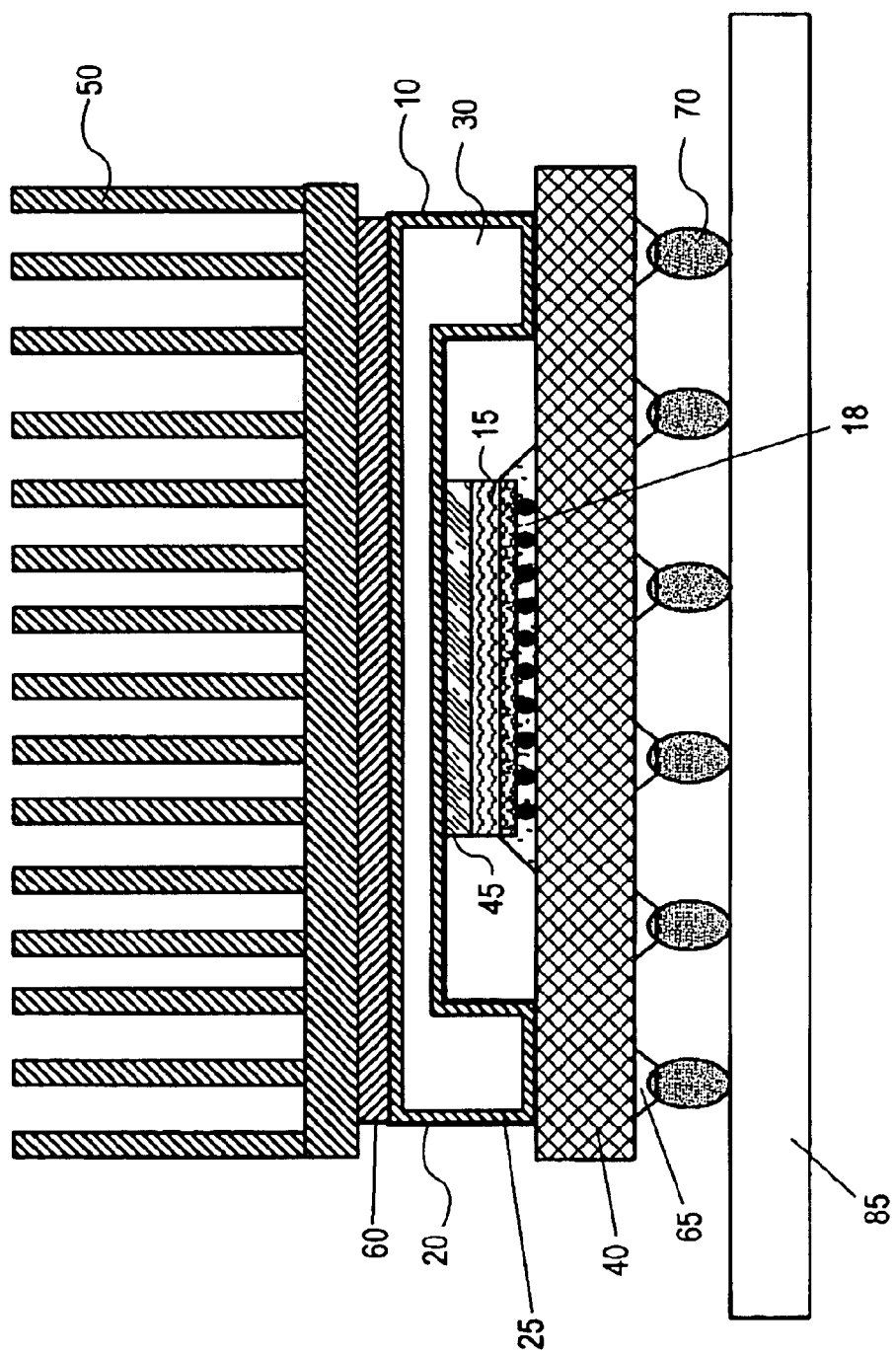
FIG. 2 shows an embodiment of an IC package that includes a semiconductor die and a coated heat spreader.

FIG. 2 shows an embodiment of an IC package containing coated heat spreader 10. Flip chip die 15 is mounted on package substrate 40 via die bumps and underfill 18. Alternatively, die 15 may be configured for mounting by other means besides a ball grid array (BGA"). For example, flip chip die 15 may be mounted by a pin grid array ("PGA"). The flip chip die may be any active or passive electronic device, e.g., a microprocessor or a memory chip. Package substrate 40 includes pads 65 and solder bumps 70 for mounting to a PCB 85. In other embodiments, substrate 40 may be mounted to a PCB 85 by other means.

Heat spreader 10 takes the form of a cap, with sidewalls extending down to package substrate 40. A surface of heat spreader 10 is adjacent and thermally coupled to TIM 45.

The TIM 45 in FIG. 2 is a solder. In other embodiments, TIM 45 may be of a variety of materials, such as organic, inorganic, or hybrid materials. Inorganic TIMs may include any solder material, e.g., conventional solders such as alloys of zinc and copper, and alloys of tin, e.g., eutectic tin/lead, tin/silver/copper, or tin bismuth. In principle, any metal or metal alloy solder may be used as a solder TIM. Examples of other alloys include Sn/Pb/Ag, Sn/Ag/Cu/Sb, Sn/Zn/Bi, and Sn/Zn. Suitable alloys may be readily obtained from commercial suppliers, e.g., Multicore, AIM, and SDK. Organic TIMs generally adhere well to heat spreaders that are not coated, because oxide formation is tolerable. Organic TIMs can maintain good adhesion despite surface oxides on the heat spreader. Organic TIMs may be, e.g., made of polymer. Heat spreaders with surface oxides may adhere poorly to inorganic and inorganic-organic hybrid TIMs, since oxides generally jeopardize inorganic joint adhesion. Inorganic-organic hybrid TIMs may be, e.g., solder-polymer TIMs. For these TIMs, the heat spreader must generally be coated.

One solution is to plate the heat spreader with a gold layer over a nickel layer ("Au/Ni finish") to protect against corrosion by preventing oxides from forming. Applying an Au/Ni finish, however, involves a costly plating process with long through put times, and requires disposing of environmentally unfriendly plating bath chemicals. And the Au/Ni finish provides poor adhesion for organic material in moisture and thermal cycling conditions common in industrial electronics processes. Because of the moisture levels and thermal cycling common to electronics industry processes, TIMs made of inorganic-organic hybrids may not adhere well to heat spreaders coated with the Au/Ni finish. Thus the Au/Ni finish may provide an unsatisfactory solution to the problem of oxide formation for inorganic-organic hybrids TIMs.

An OSP coating on a heat spreader can provide an improved wetting surface for both TIMs made of inorganics and TIMs made of inorganic-organic hybrids. Compared to Au/Ni plating processes, OSP coating processes typically require lower through put time, less floor space, and less costly equipment.

The IC package of FIG. 2 further includes a heat sink 50, which is thermally coupled to heat spreader 10 via a second TIM 60. The second TIM may be selected as needed from any materials suitable for use with a heat sink.

Figure 3:
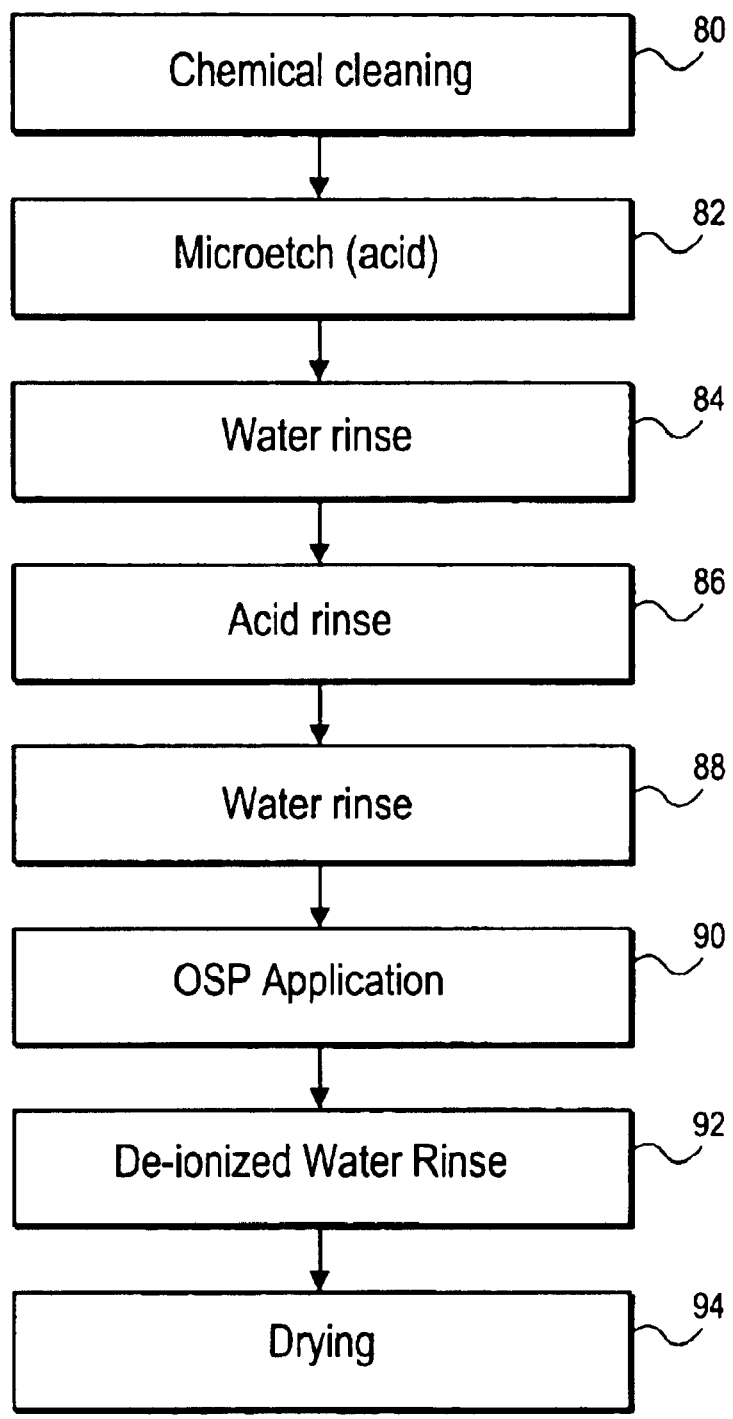
FIG. 3 shows a process flow diagram for manufacturing an embodiment of a coated heat spreader.

FIG. 3 shows a flow diagram illustrating one embodiment of a method for coating a heat spreader body with an organic surface protectant ("OSP") in accordance with the present inventions. In step 80, the heat spreader body 30 is chemically cleaned to remove oxidation and oil residue that may be present on the surface of the heat spreader body. Preferably, chemical cleaning step 80 is carried out in alkaline solution. The cleaning solution may be heated above room temperature during chemical cleaning in step 80.

After chemical cleaning, the heat spreader body is microetched in acid solution in step 82 to provide a matte texture to the surface of the body. Microetching may be carried out in any suitable acid solution, e.g., aqueous nitric acid. The acid solution may be heated slightly above room temperature during etching step 82.

After microetching, the heat spreader body undergoes a water rinse in step 84, an acid rinse in step 86, e.g., using 5–10% sulfuric acid, and then another water rinse in step 88.

The heat spreader body is now ready for OSP application in step 90. Step 90 is carried out by dipping the heat spreader body 30 in a solution of the OSP. The dipping dwell time in step 90 may be varied as needed to provide an effective coating. For dipping a plurality of heat spreader bodies, the bodies are preferably placed into a strainer in such a way as to minimize contact. Alternatively, the OSP may be applied by spraying the heat spreader body with a solution of the OSP.

An OSP coating may be directly applied to the heat spreader body surface as in the preferred embodiment shown in FIG. 3. Alternatively, the heat spreader body surface may be first coated with another material and then coated with the OSP. For example, a copper heat spreader body may be plated first with nickel or palladium, then coated with the OSP.

After the application of the OSP, the coated heat spreader body 30 is then rinsed in de-ionized water at step 92. The coated heat spreader is then dried in step 94, after which it is ready for inspection, followed by packaging, shipping, and storage. Preferably, the coated heat spreader should be packaged and stored in a low humidity environment in a manner that avoids physical contact to device attachment sites. Preferably, the coated heat spreaders are handled only at the edges thereof or using gloves, because human hands may transfer oils containing corrosive salts and acids, which are a detriment to adhesion.

It should be noted that the specific chemistries, concentrations, and temperatures for the various baths used in the steps of FIG. 3 will vary depending on the particular OSP and heat spreader body used. For example, an OSP supplier may provide recommendations for applying the particular OSP of that supplier.

While embodiments of the invention have been described above, those embodiments illustrate but do not limit the invention. Adaptations and variations of those embodiments are within the scope of the invention as set forth in the following claims.

We claim:

1. An apparatus, comprising:
   an IC die:
   a thermal interface material comprising an inorganic material in direct contact with the IC die; and
   a thermally conductive heat spreader body coated with an organic surface protectant in direct contact with the thermal interface material.

2. The apparatus of claim 1, wherein the heat spreader body comprises copper.

3. The apparatus of claim 1, wherein the organic surface protectant comprises one or more imidazole compounds.

4. The apparatus of claim 1, wherein the organic surface protectant comprises one or more triazole compounds or salts thereof.

5. A heat spreader as claimed in claim 1, wherein the coating completely envelops the body.

6. An IC package, comprising;
   a package substrate;
   an IC die attached to the substrate;
   a thermal interface material comprising an inorganic material in direct contact with the IC die; and
   a thermally conductive heat spreader body coated with an organic surface protectant in direct contact with the thermal interface material.

7. An IC package as claimed in claim 6, wherein the coating completely envelops the body.

8. An IC package according to claim 6, wherein the thermal interface material is a solder or solder-polymer hybrid.

9. An IC package according to claim 6, wherein the body comprises copper.

10. An IC package according to claim 6, wherein the organic surface protectant comprises one or more triazole compounds or salts thereof.

11. An IC package according to claim 6, wherein the first surface is coated with a metal.

12. A printed circuit board assembly comprising:
   a printed circuit board;
   an IC die electronically coupled to the printed circuit board;
   a thermal interface material comprising an inorganic material in direct contact with the IC die; and
   a thermally conductive heat spreader body coated with an organic surface protectant in direct contact with the thermal interface material.

13. A printed circuit board assembly as claimed in claim 12, wherein the thermal interface material is a solder or solder-polymer hybrid.

14. A printed circuit board assembly as claimed in claim 12, wherein the IC die is directly attached to the printed circuit board.

15. A printed circuit board assembly as claimed in claim 12, wherein the IC die is attached to a package substrate that is attached to the printed circuit board.

* * * * *